US 12,198,206 B2

(12) United States Patent
Perumalla et al.

(10) Patent No.: US 12,198,206 B2
(45) Date of Patent: Jan. 14, 2025

(54) ARTIFICIAL INTELLIGENCE ENABLED AIR QUALITY CONTROL

(71) Applicant: INTERNATIONAL BUSINESS MACHINES CORPORATION, Armonk, NY (US)

(72) Inventors: Saraswathi Sailaja Perumalla, Visakhapatnam (IN); Sarbajit K. Rakshit, Kolkata (IN); Gautam Zalpuri, Boxborough, MA (US); Amit Sharma, Malvern, PA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 171 days.

(21) Appl. No.: 17/651,274

(22) Filed: Feb. 16, 2022

(65) Prior Publication Data
US 2023/0260055 A1 Aug. 17, 2023

(51) Int. Cl.
*G06F 30/27* (2020.01)
*G05B 17/02* (2006.01)
*G06Q 50/04* (2012.01)

(52) U.S. Cl.
CPC ............. *G06Q 50/04* (2013.01); *G05B 17/02* (2013.01); *G06F 30/27* (2020.01); *G05B 2219/2614* (2013.01)

(58) Field of Classification Search
CPC .............. G06Q 50/04; G05B 17/02; G05B 2219/2614; G06F 30/27; G06F 30/20
USPC ............................................................ 703/6
See application file for complete search history.

(56) References Cited

U.S. PATENT DOCUMENTS

| 2015/0347647 | A1* | 12/2015 | Osborne | ................. | B09C 1/002 |
| | | | | | 703/6 |
| 2016/0328883 | A1* | 11/2016 | Parfenov | ................. | G06T 17/00 |
| 2017/0323240 | A1* | 11/2017 | Johnson | ................. | G06Q 10/04 |
| 2020/0348662 | A1 | 11/2020 | Cella | | |

(Continued)

FOREIGN PATENT DOCUMENTS

| CN | 113356916 A | | 9/2021 | | |
| WO | WO2021108680 | * | 11/2020 | ........... | G05B 19/418 |

(Continued)

OTHER PUBLICATIONS

What is the Monte Carlo Simulation?, printed Oct. 12, 2023, pp. 1-6.*

(Continued)

*Primary Examiner* — Juan C Ochoa
(74) *Attorney, Agent, or Firm* — Elliot J. Shine

(57) ABSTRACT

A method, computer system, and a computer program product for simulating industrial safety is provided. The present invention may include receiving data for a physical ecosystem, the physical ecosystem being comprised of a plurality of physical assets. The present invention may include generating a digital twin of the physical ecosystem, wherein the digital twin includes a digital representation of the plurality of physical assets. The present invention may include simulating a performance of the digital twin in a plurality of conditions. The present invention may include providing one or more recommendations to a user based on the performance of the digital twin in the plurality of conditions.

18 Claims, 5 Drawing Sheets

(56) References Cited

U.S. PATENT DOCUMENTS

2021/0357422 A1* 11/2021 Cella ................ H04L 41/0631
2022/0108262 A1*  4/2022 Cella ............. G06Q 10/063118
2023/0300626 A1*  9/2023 Montalvo ............ G06N 20/10
                                                          370/329

FOREIGN PATENT DOCUMENTS

WO       2021143068 A1    7/2021
WO      WO2023172292    *  8/2022  ............ H04W 16/02

OTHER PUBLICATIONS

Ben Lutkevich, What is a Monte Carlo simulation?, printed Oct. 12, 2023, pp. 1-4.*
Disclosed Anonymously, "Digital Twin Based HVAC Contamination Control," IP.com, Aug. 7, 2020, 5 pages, IP.com No. IPCOM000263224D, Retrieved from the Internet: <URL: https://priorart.ip.com/IPCOM/000263224>.
Guest Commentary, "A Digital Twin Approach to Predictive Maintenance," Information Week [online], Nov. 26, 2018 [accessed on Nov. 8, 2021], 5 pages, Retrieved from the Internet: <URL: https://www.informationweek.com/ai-or-machine-learning/a-digital-twin-approach-to-predictive-maintenance>.
Mell, et al., "The NIST Definition of Cloud Computing", National Institute of Standards and Technology, Special Publication 800-145, Sep. 2011, 7 pages.

* cited by examiner

ARTIFICIAL INTELLIGENCE ENABLED AIR QUALITY CONTROL

BACKGROUND

The present invention relates generally to the field of computing, and more particularly to digital twins.

Manufacturers and/or other businesses may employ individuals who may work with physical assets within a physical ecosystem. Physical assets may include, but are not limited to including, turning machines, shapers and/or planers, drilling machines, milling machines, grinding machines, power saws, presses, various robotic systems, amongst other industrial machines. The physical assets comprising the physical ecosystem may require different types of chemicals and/or fuel in performing activities, such as, but not limited to, coolant, lubricant, gas, and/or oil.

By-products of performing activities with the physical assets may include, dust, harmful chemicals, smells, gases, and/or other byproducts. Accordingly, manufacturers and/or other business may want to proactively identify physical assets which may generate by-products which may be harmful to the individuals operating the physical asset and implement various safety measures.

SUMMARY

Embodiments of the present invention disclose a method, computer system, and a computer program product for industrial safety utilizing digital twins. The present invention may include receiving data for a physical ecosystem, the physical ecosystem being comprised of a plurality of physical assets. The present invention may include generating a digital twin of the physical ecosystem, wherein the digital twin includes a digital representation of the plurality of physical assets. The present invention may include simulating a performance of the digital twin in a plurality of conditions. The present invention may include providing one or more recommendations to a user based on the performance of the digital twin in the plurality of conditions.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
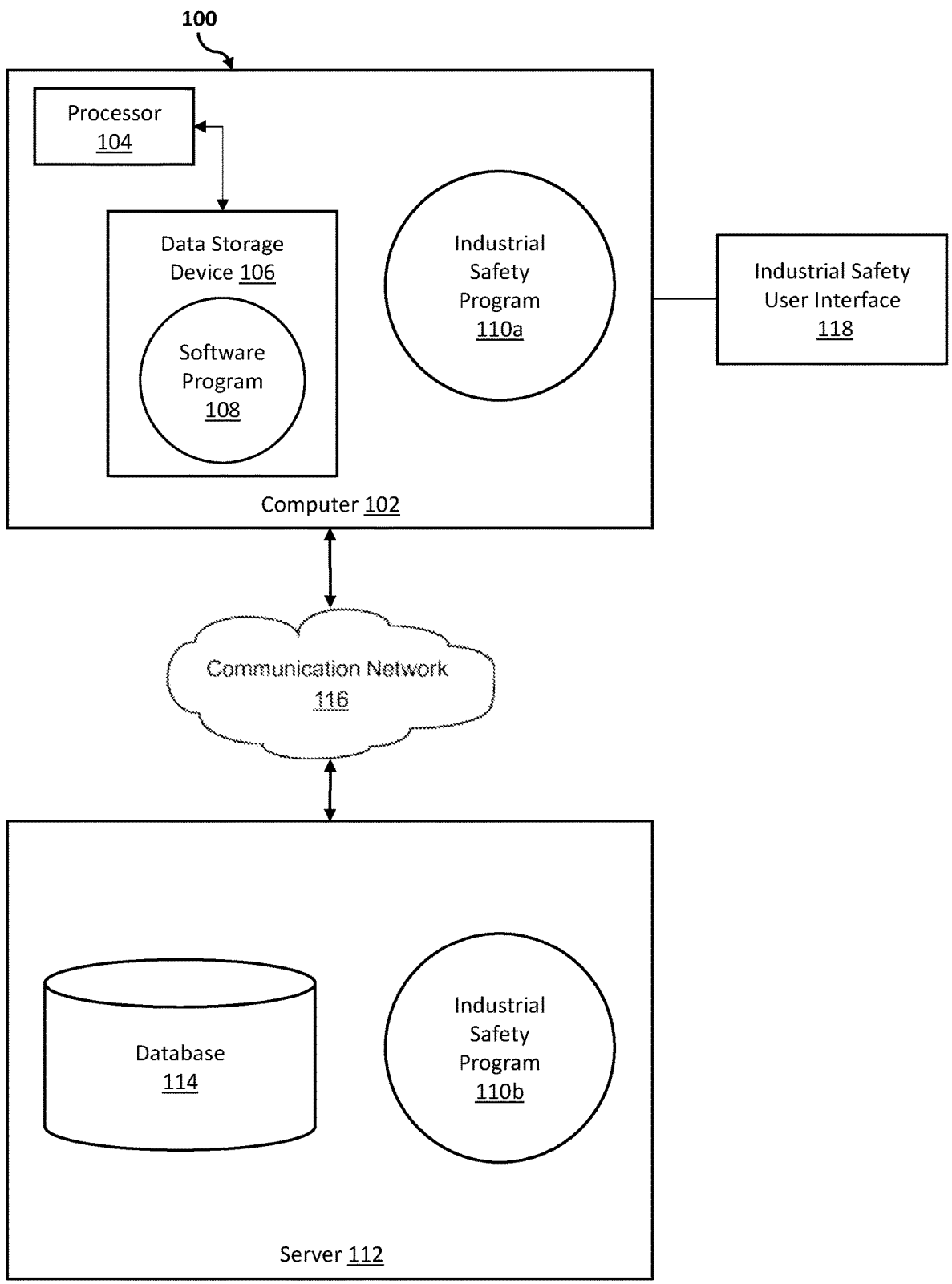
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method and program product for industrial safety. As such, the present embodiment has the capacity to improve the technical field of digital twins by simulating by-product accumulation of physical assets within a physical ecosystem. More specifically, the present invention may include receiving data for a physical ecosystem, the physical ecosystem being comprised of a plurality of physical assets. The present invention may include generating a digital twin of the physical ecosystem, wherein the digital twin includes a digital representation of the plurality of physical assets. The present invention may include simulating a performance of the digital twin in a plurality of conditions. The present invention may include providing one or more recommendations to a user based on the performance of the digital twin in the plurality of conditions.

As described previously, manufacturers and/or other businesses may employ individuals who may work with physical assets within a physical ecosystem. Physical assets may include, but are not limited to including, turning machines, shapers and/or planers, drilling machines, milling machines, grinding machines, power saws, presses, various robotic systems, amongst other industrial machines. The physical assets comprising the physical ecosystem may require different types of chemicals and/or fuel in performing activities, such as, but not limited to, coolant, lubricant, gas, and/or oil.

By-products of performing activities with the physical assets may include, dust, harmful chemicals, smells, gases, and/or other byproducts. Accordingly, manufacturers and/or other business may want to proactively identify physical assets which may generate by-products which may be harmful to the individuals operating the physical asset and implement various safety measures.

Therefore, it may be advantageous to, among other things, receive data for a physical ecosystem, the physical ecosystem being comprised of a plurality of physical assets, generate a digital twin of the physical ecosystem, wherein the digital twin includes a digital representation of the plurality of physical assets, simulate a performance of the digital twin in a plurality of conditions, provide one or more recommendations to a user based on the performance of the digital twin in the plurality of conditions.

According to at least one embodiment, the present invention may improve the generation of digital twins representing a physical ecosystem by receiving data for both the physical ecosystem and a plurality of physical objects comprising the physical ecosystem.

According to at least one embodiment, the present invention may improve safety on an industrial floor by simulating the by-products physical assets comprising a physical ecosystem based on data received and/or accessed with respect to the conditions by which those physical assets may be operated.

According to at least one embodiment, the present invention may improve safety on an industrial floor by simulating by-product accumulation and/or high by-product concentrations within a physical ecosystem and displaying the by-product accumulation to a user within an industrial safety user interface utilizing at least unique colors, numbers, flags, and/or other visual representations in displaying safety levels of the by-product to the user.

According to at least one embodiment, the present invention may improve simulation of digital twins by enabling a user to manually input the plurality of conditions by which the physical ecosystem may be simulated such that the user may be aided in informed decision making.

According to at least one embodiment, the present invention may improve safety on an industrial floor by providing one or more recommendations to the user based on the performance of the digital twin under a plurality of conditions. The simulations being displayed to use in an industrial safety interface which may utilize an intelligent real estate and facilities management solution enabling a user to interactively engage with an industrial safety program.

Referring to FIG. 1, an exemplary networked computer environment 100 in accordance with one embodiment is depicted. The networked computer environment 100 may include a computer 102 with a processor 104 and a data storage device 106 that is enabled to run a software program 108 and an industrial safety program 110a. The networked computer environment 100 may also include a server 112 that is enabled to run an industrial safety program 110b that may interact with a database 114 and a communication network 116. The networked computer environment 100 may include a plurality of computers 102 and servers 112, only one of which is shown. The communication network 116 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with the server computer 112 via the communications network 116. The communications network 116 may include connections, such as wire, wireless communication links, or fiber optic cables. As will be discussed with reference to FIG. 3, server computer 112 may include internal components 902a and external components 904a, respectively, and client computer 102 may include internal components 902b and external components 904b, respectively. Server computer 112 may also operate in a cloud computing service model, such as Software as a Service (SaaS), Platform as a Service (PaaS), or Infrastructure as a Service (IaaS). Server 112 may also be located in a cloud computing deployment model, such as a private cloud, community cloud, public cloud, or hybrid cloud. Client computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the industrial safety program 110a, 110b may interact with a database 114 that may be embedded in various storage devices, such as, but not limited to a computer/mobile device 102, a networked server 112, or a cloud storage service.

According to the present embodiment, a user using a client computer 102 or a server computer 112 may use the industrial safety program 110a, 110b (respectively) to by simulate by-product accumulation of physical assets within a physical ecosystem. The industrial safety method is explained in more detail below with respect to FIG. 2.

Figure 2:
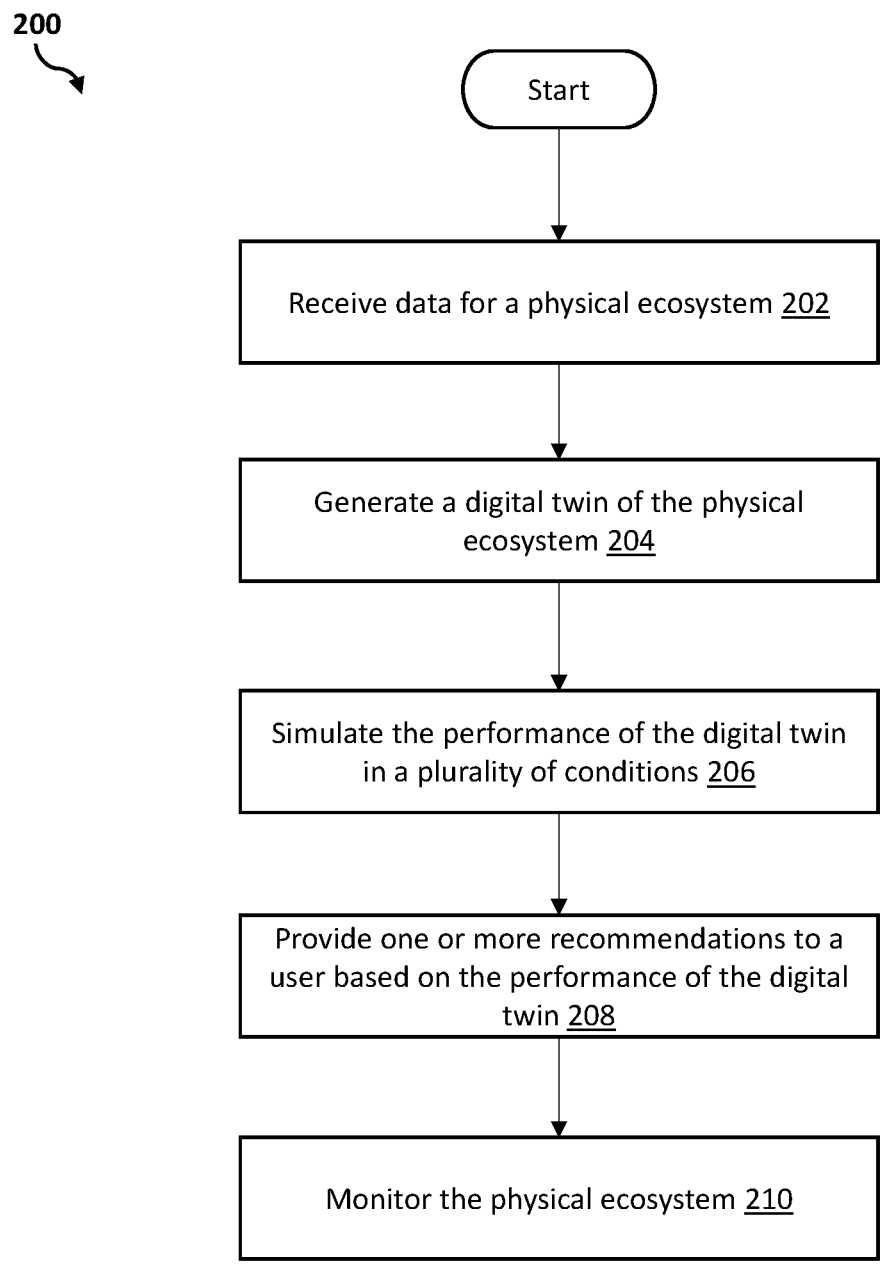
FIG. 2 is an operational flowchart illustrating a process for industrial safety according to at least one embodiment.

Referring now to FIG. 2, an operational flowchart illustrating the exemplary industrial safety process 200 used by the industrial safety program 110a and 110b (hereinafter industrial safety program 110) according to at least one embodiment is depicted.

At 202, the industrial safety program 110 receives data for a physical ecosystem. The physical ecosystem may be an industrial floor, warehouse, manufacturing plant, and/or other factory. The physical ecosystem may be comprised of a plurality of physical assets. The physical assets may include, but are not limited to including, turning machines, shapers and/or planers, drilling machines, milling machines, grinding machines, power saws, presses, various robotic systems, amongst other industrial machines. The physical assets comprising the physical ecosystem may require different types of chemicals and/or fuel in performing activities, such as, but not limited to, coolant, lubricant, gas, and/or oil. The physical assets comprising the physical ecosystem may be operated by one or more individuals. The physical assets may produce and/or emit by-products such as, but not limited to, dust, harmful chemicals, smells, gases, toxins, amongst other by-products.

The industrial safety program 110 may receive and/or access data with respect to the physical ecosystem and/or the plurality of physical assets comprising the physical ecosystem from a user, one or more Internet of Things (IoT) devices, images and/or 3D scans of the physical ecosystem and/or physical assets, smart wearable devices associated with the individuals operating the physical assets, one or more publicly available resources, amongst other methods of receiving and/or accessing data. The user may provide data to the industrial safety program 110 in an industrial safety user interface 118. The industrial safety user interface 118 may be displayed by the industrial safety program 110 in at least an internet browser, dedicated software application, and/or as an integration with a third party software application. The industrial safety program 110 may store the data received and/or accessed with respect to the physical ecosystem and/or physical assets comprising the physical ecosystem in a knowledge corpus (e.g., database 114). As will be explained in more detail below, the industrial safety program 110 may continuously update and/or add data stored in the knowledge corpus (e.g., database 114) based on real time data received from at least the one or more IoT devices and/or smart wearable devices associated with the individuals operating the physical assets.

Data received and/or accessed by the industrial safety program 110 with respect to the physical ecosystem may include, but is not limited to including, square footage, property size, location, material used in construction, window types, year built, blueprints, roofing details, architecture, information on appliances, occupancy, ventilation systems, airflow details, as well as real time data from one or more IoT devices associated with the physical ecosystem. The one or more IoT devices associated with the physical ecosystem may include, but are not limited to including, thermostats, lighting, air quality, smoke detectors, carbon monoxide detectors, irrigations systems, security, air conditioning, movement, and ventilation systems, amongst other IoT devices. The one or more IoT devices may perform readings of the environment within the physical ecosystem. The IoT devices may be connected to one or more sensors (e.g., temperature sensors, motion sensors, humidity sensors, pressure sensors, accelerometers, gas sensors, multi-purpose IoT sensors, amongst other sensors) to perform the one or more readings. The data from the one or more readings performed by the IoT devices may be stored on the IoT device itself and/or broadcasted to the knowledge corpus (e.g., database 114).

Data received and/or accessed by the industrial safety program 110 with respect to the physical assets comprising the physical ecosystem may include, but are not limited to including, images, videos, and/or 3D scans of the physical assets received from a camera of the one or more IoT devices, a brand, model number, bill of materials, product codes, part numbers, design specifications, production processes, engineering information, material composition of parts, amongst other data for the physical assets. As will be explained in more detail below, the industrial safety program 110 may also receive real time data from the one or more IoT devices associated with the physical assets. The real time data may include, but is not limited to including, maintenance/upkeep, operating conditions, health of the machine and/or machine components, hours the machine is utilized per day, usage patterns, structural health, amongst other IoT device/sensor based analytic data.

Data received and/or accessed by the industrial safety program 110 with respect to the physical assets comprising the physical ecosystem may be stored in the knowledge corpus (e.g., database 114). The industrial safety program 110 may utilize a computer-aided design (CAD) package amongst other photogrammetry software in processing the data stored in the knowledge corpus (e.g., database 114). As will be explained in more detail below, the data stored in the knowledge corpus (e.g., database 114) may be utilized by the industrial safety program 110 in generating a digital twin of the physical ecosystem and/or the plurality of physical assets comprising the physical ecosystem.

All data received by the industrial safety program 110, including data received from smart wearable devices associated with individuals operating and/or maintaining the physical assets of the physical ecosystem, shall not be construed as to violate or encourage the violation of any local, state, federal, or international law with respect to privacy protection. The industrial safety program 110 may require consent from any individual for which data may be received and/or accessed and/or require consent on behalf of the individual from the user (assuming the user has authority to provide such consent).

At 204, the industrial safety program 110 generates a digital twin. The industrial safety program 110 may generate the digital twin based on the data received and/or accessed for the physical system. The digital twin may include at least the physical ecosystem and/or the plurality of physical assets comprising the physical ecosystem. A digital twin may be a digital representation of at least an object, entity, and/or system that spans the object, entity, and/or system's lifecycle. The digital twin may be updated using real time data, and may utilize, at least, simulation, machine learning, and/or reasoning in aiding informed decision making.

The digital twin may be utilized by the industrial safety program 110 in simulating by-products of the physical assets comprising the physical ecosystem. By-products of performing activities with the physical assets may include, dust, chemicals, smells, gases, heat, amongst other by-products. As will be explained in more detail below with respect to step 206, the industrial safety program 110 may utilize the digital twin of the physical ecosystem in identifying areas of interest within the physical ecosystem which may be susceptible to by-product accumulation and/or high by-product concentrations. The digital twin may be updated in real time based on at least real time data received from the one or more IoT devices, smart wearable devices, and/or other real time data received for the physical ecosystem and/or physical assets comprising the physical ecosystem. Real time and/or additional data may be data received after the industrial safety program 110 generates the digital twin for the physical ecosystem and/or physical assets comprising the physical ecosystem.

For example, the physical ecosystem may be an industrial floor comprised of a plurality of industrial machines. The industrial safety program 110 may generate the digital twin of the industrial floor and the plurality of industrial machines. The digital twin may be a replica of the industrial floor and the plurality of industrial machines based on the data received and/or accessed at step 202. As will be explained in more detail below, the industrial safety program 110 may simulate the performance of the digital twin including the by-products produced by the plurality of industrial machines as well as how those by-products may remain within the physical ecosystem and potentially harm the one or more individuals operating the plurality of industrial machines.

At 206, the industrial safety program 110 simulates the performance of the digital twin. The industrial safety program 110 may simulate the performance of the digital twin in a plurality of conditions based on at least the data stored in the knowledge corpus (e.g., database 114). The industrial safety program 110 may utilize one or more machine learning models and/or one or more simulation methods in simulating the performance of the digital twin in the plurality of conditions. The one or more machine learning models may include, but are not limited to including, Convolutional Neural Networks (CNNs), Artificial Neural Networks (ANNs), Support Vector Machine (SVM), K-Nearest Neighbors (KNN), Naïve Bayes, and/or a hybrid model. The one or more simulation methods may include, but are not limited to including, a Monte Carlo simulation process, agent based simulation model, discrete event simulation model, and/or a system dynamic simulation models, amongst other simulation methods. The industrial safety program 110 may additionally utilize a statistical program such as IBM's SPSS® (SPSS® and all SPSS-based trademarks are trademarks or registered trademarks of International Business Machines Corporation in the United States, and/or other countries), or Statistical Product and Service Solution, in optimizing the one or more simulation methods.

The industrial safety program 110 may determine the conditions in which the digital twin may be simulated based on at least the data stored in the knowledge corpus (e.g., database 114) and/or real time data received from the one or more IoT devices, images and/or 3D scans of the physical ecosystem and/or physical assets, smart wearable devices associated with the individuals operating the physical asset, amongst other real time data. The industrial safety program 110 may simulate at least the by-products produced by each of the plurality of physical assets comprising the physical ecosystem and determine at least by-product accumulation and/or high by-product concentrations based on the physical ecosystem. The industrial safety program 110 may display the simulated by-product accumulation and/or high by-product concentrations within the physical ecosystem in the industrial safety user interface 118. The industrial safety program 110 may utilize unique colors, numbers, flags, and/other visual representations to represent safety levels of by-product accumulation and/or by-product concentrations. The safety levels may be determined based on at least safety precautions utilized by the one or more individuals operating the physical assets of the physical ecosystem. For example, if the individuals operating the industrial machinery of an industry floor are required to wear hazmat suits, the industrial safety program 110 may generate a different heat map than an industry floor which is populated by individuals wearing only a respirator mask.

The industrial safety program 110 may also simulate the digital twin based on conditions manually input by the user. The user may manually input the plurality of conditions for which the industrial safety program 110 may simulate the digital twin of the physical ecosystem in the industrial safety user interface 118. For example, a user may be operating the machines comprising an industry floor 8 hours per day. The user may enter within the industrial safety interface 118 parameters by which the machines comprising the industry floor operate 12 hours per day. The industrial safety program 110 may simulate the conditions specified by the user and display in the industrial safety user interface the by-product accumulation. In this example, the industrial safety program 110 may also enable the user to compare the by-product accumulation of the 8 hours of operation versus the 12 hours of operation by displaying side-by-side simulations and/or providing addition statistics associated with both simulations.

At 208, the industrial safety program 110 provides one or more recommendations to the user based on the performance of the digital twin. The industrial safety program 110 may display the one or more recommendations to the user in the airflow modeling user interface 118, to a smart wearable device associated with an individual, and/or to another device associated with the user and/or induvial operating a physical asset as a notification, text message, email, and/or other notification method.

The industrial safety program 110 may utilize an intelligent real estate and facilities management solution, such as, but not limited to, IBM TRIRIGA® (IBM TRIRIGA® and all IBM TRIRIGA-based trademarks are trademarks or registered trademarks of International Business Machines Corporation in the United States, and/or other countries), in providing one or more recommendations to the user based on the simulation of the digital twin for the plurality of conditions. The intelligent real estate and facilities management solution may be displayed by the industry safety program 110 in the industrial safety user interface 118 which may enable the user to interactively engage with the industrial safety program 110. The industrial safety program 110 may also utilize the intelligent real estate and facilities management solution in displaying recommendations such as, rearrangement of the physical assets, installation of ventilation systems, air purification placement, window installation, structural recommendations, wall and/or other structure removals, amongst other recommendations. The industrial safety program 110 may include projected costs for each of the one or more recommendations to the user within the industrial safety user interface 118.

The industrial safety program 110 may also provide recommendations such as, but not limited to, installation of more IoT devices, recommend utilization of different fuel sources for a physical asset, maintenance reminders, safety alerts for individuals, amongst other recommendations.

In an embodiment, the user may enable the industrial safety program 110 to adjust the environment within the physical ecosystem utilizing at least the one or more IoT devices associated with the physical ecosystem. The industrial safety program 110 may adjust the one or more IoT devices associated with the physical ecosystem automatically and/or require authorization from the user. The user may authorize automatic adjustments of the one or more IoT devices in the industrial safety user interface 118. Additionally, the user may set parameters by which the industrial safety program 110 may adjust the IoT devices. The parameters may include, maximum and/or minimum ventilation, maximum and/or minimum temperatures, hours in which the industrial safety program 110 may be automated, amongst other parameters.

At 210, the industrial safety program 110 monitors the physical ecosystem. The industrial safety program 110 may monitor the physical ecosystem based on at least the real time data received from the one or more IoT devices, images and/or 3D scans of the physical ecosystem and/or physical assets, additional data received from the user within the industrial safety user interface 118, data received from smart wearable devices associated with individuals operating a physical asset, amongst other real time data which may be received and/or accessed by the industrial safety program 110. The industrial safety program 110 may continuously simulate the digital twin based on the real time data received in order to provide at least additional recommendations and/or real time alerts.

The industrial safety program 110 may also monitor any adjustments made by the user based on the recommendations provided to the user at step 208. The industrial safety program 110 may monitor at least the efficacy of adjustments and utilize the by-product accumulation data in retraining the one or more machine learning models discussed above. Additionally, the industrial safety program 110 may receive feedback from the user with respect to adjustments in order to improve the intelligent facilities and management solution. The industrial safety program 110 may utilize the feedback received by the user to improve cost projections, recommendations, and/or data utilized in simulations of digital twin performance.

It may be appreciated that FIG. 2 provides only an illustration of one embodiment and do not imply any limitations with regard to how different embodiments may be implemented. Many modifications to the depicted embodiment(s) may be made based on design and implementation requirements.

Figure 3:
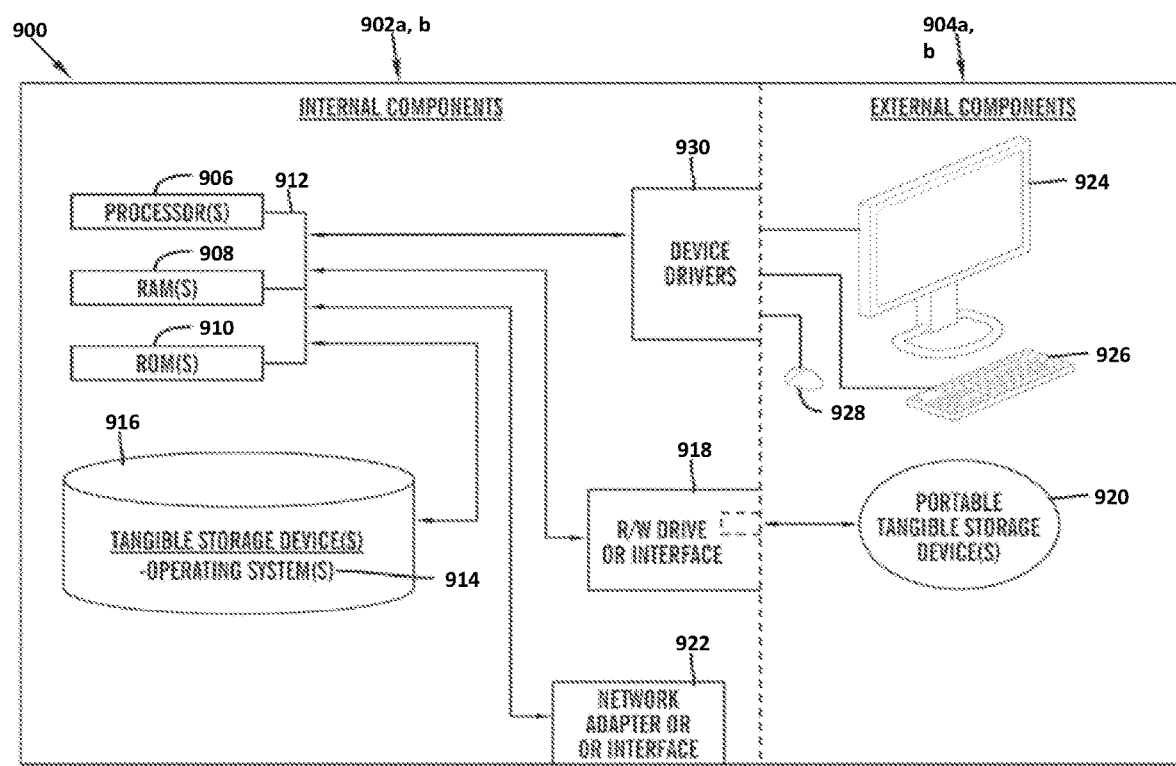
FIG. 3 is a block diagram of internal and external components of computers and servers depicted in FIG. 1 according to at least one embodiment.

FIG. 3 is a block diagram 900 of internal and external components of computers depicted in FIG. 1 in accordance with an illustrative embodiment of the present invention. It should be appreciated that FIG. 3 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

User client computer 102 and network server 112 may include respective sets of internal components 902*a, b* and external components 904*a, b* illustrated in FIG. 3. Each of the sets of internal components 902a, b includes one or more processors 906, one or more computer-readable RAMs 908 and one or more computer-readable ROMs 910 on one or more buses 912, and one or more operating systems 914 and one or more computer-readable tangible storage devices 916. The one or more operating systems 914, the software program 108, and the industrial safety program 110a in client computer 102, and the industrial safety program 110b in network server 112, may be stored on one or more computer-readable tangible storage devices 916 for execution by one or more processors 906 via one or more RAMs 908 (which typically include cache memory). In the embodiment illustrated in FIG. 3, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902a, b also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 and the industrial safety program 110a and 110b can be stored on one or more of the respective portable computer-readable tangible storage devices 920, read via the respective R/W drive or interface 918 and loaded into the respective hard drive 916.

Each set of internal components 902a, b may also include network adapters (or switch port cards) or interfaces 922 such as a TCP/IP adapter cards, wireless wi-fi interface cards, or 3G or 4G wireless interface cards or other wired or wireless communication links. The software program 108 and the industrial safety program 110a in client computer 102 and the industrial safety program 110b in network server computer 112 can be downloaded from an external computer (e.g., server) via a network (for example, the Internet, a local area network or other, wide area network) and respective network adapters or interfaces 922. From the network adapters (or switch port adaptors) or interfaces 922, the software program 108 and the industrial safety program 110a in client computer 102 and the industrial safety program 110b in network server computer 112 are loaded into the respective hard drive 916. The network may comprise copper wires, optical fibers, wireless transmission, routers, firewalls, switches, gateway computers and/or edge servers.

Each of the sets of external components 904a, b can include a computer display monitor 924, a keyboard 926, and a computer mouse 928. External components 904a, b can also include touch screens, virtual keyboards, touch pads, pointing devices, and other human interface devices. Each of the sets of internal components 902a, b also includes device drivers 930 to interface to computer display monitor 924, keyboard 926 and computer mouse 928. The device drivers 930, R/W drive or interface 918 and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
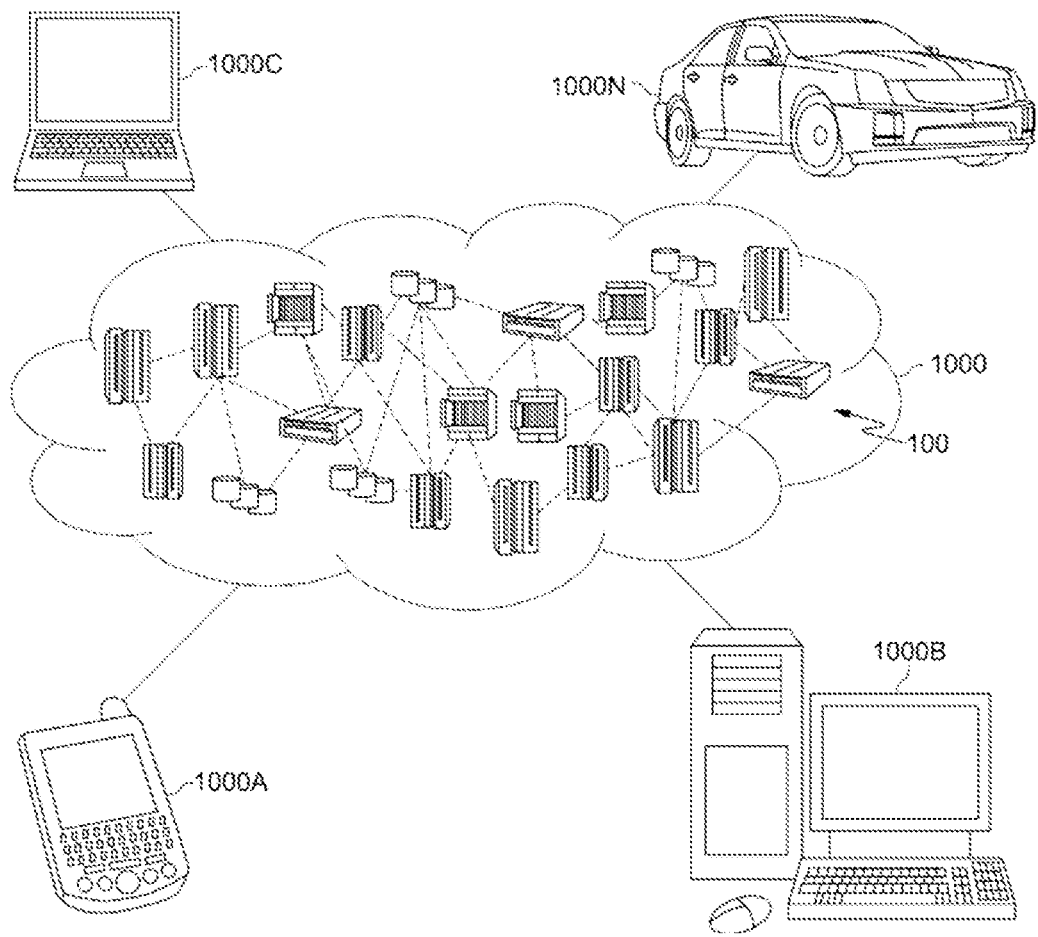
FIG. 4 is a block diagram of an illustrative cloud computing environment including the computer system depicted in FIG. 1, in accordance with an embodiment of the present disclosure.

Referring now to FIG. 4, illustrative cloud computing environment 1000 is depicted. As shown, cloud computing environment 1000 comprises one or more cloud computing nodes 100 with which local computing devices used by cloud consumers, such as, for example, personal digital assistant (PDA) or cellular telephone 1000A, desktop computer 1000B, laptop computer 1000C, and/or automobile computer system 1000N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 4 are intended to be illustrative only and that computing nodes 100 and cloud computing environment 1000 can communicate with any type of computerized device over any type of network and/or network addressable connection (e.g., using a web browser).

Figure 5:
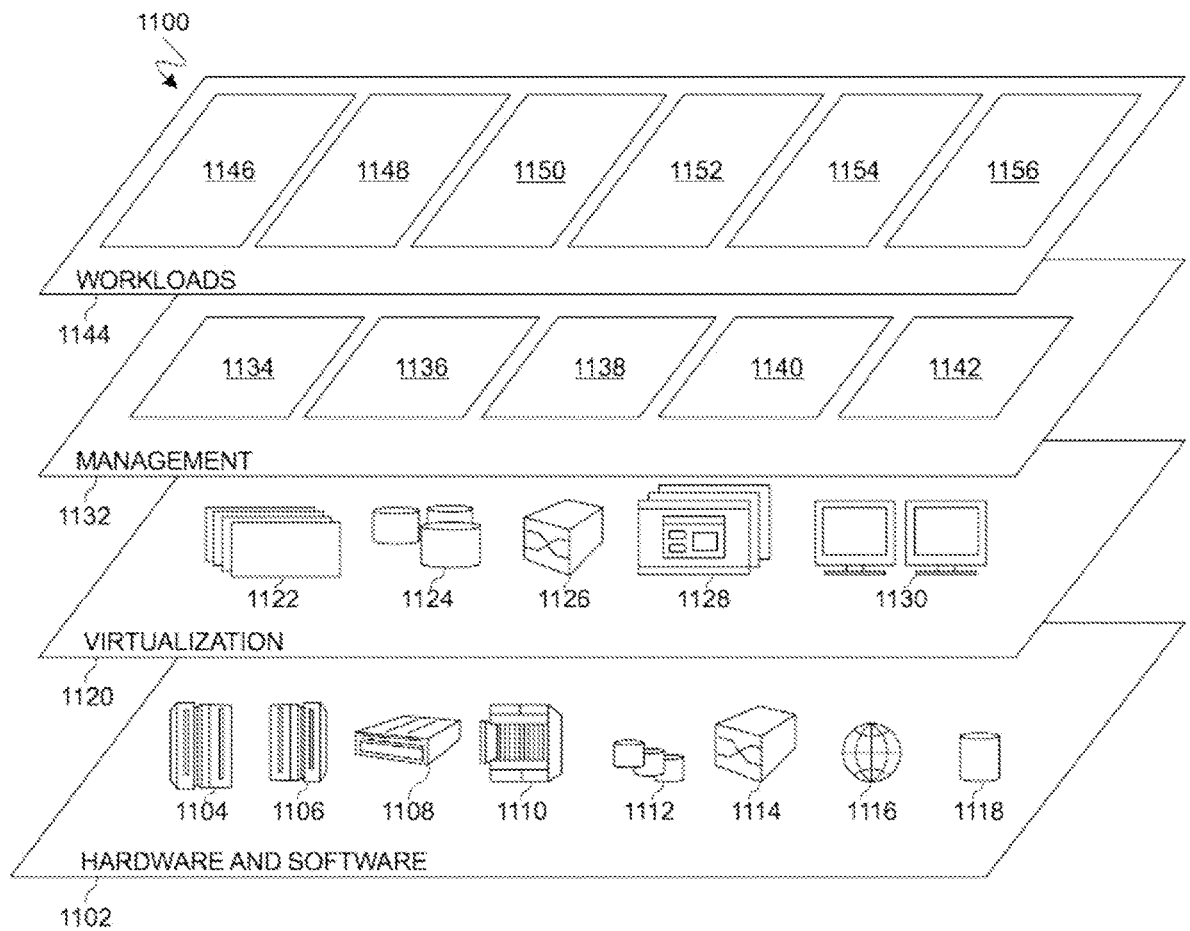
FIG. 5 is a block diagram of functional layers of the illustrative cloud computing environment of FIG. 4, in accordance with an embodiment of the present disclosure.

Referring now to FIG. 5, a set of functional abstraction layers 1100 provided by cloud computing environment 1000 is shown. It should be understood in advance that the components, layers, and functions shown in FIG. 5 are intended to be illustrative only and embodiments of the invention are not limited thereto. As depicted, the following layers and corresponding functions are provided:

Hardware and software layer 1102 includes hardware and software components. Examples of hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, management layer 1132 may provide the functions described below. Resource provisioning 1134 provides dynamic procurement of computing resources and other resources that are utilized to perform tasks within the cloud computing environment. Metering and Pricing 1136 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions which may be provided from this layer include: mapping and navigation 1146; software development and lifecycle management 1148; virtual classroom education delivery 1150; data analytics processing 1152; transaction processing 1154; and industrial safety program 1156. An industrial safety program 110a, 110b provides a way to by simulate by-product accumulation of physical assets within a physical ecosystem.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

The present disclosure shall not be construed as to violate or encourage the violation of any local, state, federal, or international law with respect to privacy protection.

What is claimed is:

1. A method for simulating industrial safety, the method comprising:
    receiving data for a physical ecosystem, the physical ecosystem being comprised of a plurality of physical assets;
    generating a digital twin of the physical ecosystem, wherein the digital twin includes a digital representation of the plurality of physical assets;
    simulating a performance of the digital twin in a plurality of conditions using one or more machine learning models and one or more simulation methods, wherein the simulation of performance of the digital twin includes by-product accumulation from the plurality of physical assets within one or more areas of interest identified within the physical ecosystem; and
    providing one or more recommendations to a user corresponding to the by-product accumulation within the one or more areas of interest based on the performance of the digital twin in the plurality of conditions, wherein the one or more recommendations are displayed to the user in an industrial safety user interface.

2. The method of claim 1, wherein the plurality of conditions are manually selected by the user, wherein the user manually identifies within the industrial safety user interface parameters by which the plurality of physical assets are operated.

3. The method of claim 2, wherein the user manually identifies a first set of parameters and a second set of parameters within the industrial safety user interface, wherein the performance of the digital twin is simulated under the first set of parameters and the second set of parameters, and wherein simulation statistics for both the first set of parameters and the second set of parameters are displayed side-by-side to the user within the industrial safety user interface.

4. The method of claim 1, further comprising:
determining safety levels for each of the one or more areas of interest based on the by-product accumulation and safety precautions utilized by one or more individuals operating the physical assets of the physical ecosystem, wherein the safety levels are overlayed on the digital twin of the physical ecosystem using visual representations including at least, one or more of, unique colors, numbers or flags, which are displayed to the user within the industrial safety user interface, wherein the by-product accumulation includes at least, one or more of, dust, chemicals, smells, gases, toxins, or heat generated by the plurality of physical assets during a performance of one or more activities.

5. The method of claim 1, further comprising:
adjusting settings for one or more Internet of Things (IoT) devices associated with the physical ecosystem based on the performance of the digital twin in the plurality of conditions, wherein settings of the one or more IoT devices are adjusted to control an environment of the physical ecosystem according to one or more parameters set by the user.

6. The method of claim 1, further comprising:
monitoring the physical ecosystem based on additional data received, wherein the additional data is received from at least one or more Internet of Things (IoT) devices associated with the physical ecosystem or one or more smart wearable devices associated with one or more individuals operating the plurality of physical assets;
modifying the digital twin and the plurality of conditions based on the additional data received;
simulating a modified digital twin under a modified plurality of conditions; and
providing a safety alert based on the simulations of the modified digital twin, wherein the safety alert is provided to at least one of the one or more smart wearable devices associated with the one or more individuals operating the plurality of physical assets using one or more notification methods.

7. The method of claim 1, wherein each of the one or more areas of interest are susceptible to by-product accumulation or high by-product concentrations, and wherein each of the one or more recommendations include at least a structural recommendations for the ecosystem designed to reduce by-product accumulation within the one or more areas of interest and a corresponding projected cost for each of the one or more recommendations in the industrial safety user interface.

8. The method of claim 1, wherein the data received for the physical ecosystem further comprises:

receiving the data for the physical ecosystem from at least, one or more of, one or more Internet of Things (IoT) devices, three-dimensional (3D) scans of the physical ecosystem, or one or more smart wearable devices associated with one or more individuals operating the plurality of physical assets; and
storing the data received for the physical ecosystem in a knowledge corpus, wherein the plurality of conditions utilized in simulating the performance of the digital twin are derived from the data stored in the knowledge corpus, and wherein the one or more simulation methods includes at least a Monte Carlo simulation process, and wherein the Monte Carlo simulation process utilizes as input the data stored in the knowledge corpus for simulating the performance of the digital twin.

9. The method of claim 1, further comprising:
monitoring an efficacy of the one or more recommendations; and
retraining the one or more machine learning models based on the efficacy of the one or more recommendations in reducing the by-product accumulation in the one or more areas of interest.

10. A computer system for simulating industrial safety, comprising:
one or more processors, one or more computer-readable memories, one or more computer-readable tangible storage medium, and program instructions stored on at least one of the one or more tangible storage medium for execution by at least one of the one or more processors via at least one of the one or more memories, wherein the computer system performs a method comprising:
receiving data for a physical ecosystem, the physical ecosystem being comprised of a plurality of physical assets;
generating a digital twin of the physical ecosystem, wherein the digital twin includes a digital representation of the plurality of physical assets;
simulating a performance of the digital twin in a plurality of conditions using one or more machine learning models and one or more simulation methods, wherein the simulation of performance of the digital twin includes by-product accumulation from the plurality of physical assets within one or more areas of interest identified within the physical ecosystem; and
providing one or more recommendations to a user corresponding to the by-product accumulation within the one or more areas of interest based on the performance of the digital twin in the plurality of conditions, wherein the one or more recommendations are displayed to the user in an industrial safety user interface.

11. The computer system of claim 10, wherein the plurality of conditions are manually selected by the user, wherein the user manually identifies within the industrial safety user interface parameters by which the plurality of physical assets are operated.

12. The computer system of claim 10, further comprising:
determining safety levels for each of the one or more areas of interest based on the by-product accumulation and safety precautions utilized by one or more individuals operating the physical assets of the physical ecosystem, wherein the safety levels are overlayed on the digital twin of the physical ecosystem using visual representations including at least, one or more of, unique colors, numbers or flags, which are displayed to the user within the industrial safety user interface, wherein the by-product accumulation includes at least, one or more of, dust, chemicals, smells, gases, toxins, or heat generated by the plurality of physical assets during a performance of one or more activities.

13. The computer system of claim 10, further comprising:
adjusting settings for one or more Internet of Things (IoT) devices associated with the physical ecosystem based on the performance of the digital twin in the plurality of conditions, wherein settings of the one or more IoT devices are adjusted to control an environment of the physical ecosystem according to one or more parameters set by the user.

14. The computer system of claim 10, further comprising:
monitoring the physical ecosystem based on additional data received, wherein the additional data is received from at least one or more Internet of Things (IoT) devices associated with the physical ecosystem or one or more smart wearable devices associated with one or more individuals operating the plurality of physical assets;
modifying the digital twin and the plurality of conditions based on the additional data received;
simulating a modified digital twin under a modified plurality of conditions; and
providing a safety alert based on the simulations of the modified digital twin, wherein the safety alert is provided to at least one of the one or more smart wearable devices associated with the one or more individuals operating the plurality of physical assets using one or more notification methods.

15. A computer program product for simulating industrial safety, comprising:
one or more non-transitory computer-readable storage media and program instructions stored on at least one of the one or more tangible storage media, the program instructions executable by a processor to cause the processor to perform a method comprising:
receiving data for a physical ecosystem, the physical ecosystem being comprised of a plurality of physical assets;
generating a digital twin of the physical ecosystem, wherein the digital twin includes a digital representation of the plurality of physical assets;
simulating a performance of the digital twin in a plurality of conditions using one or more machine learning models and one or more simulation methods, wherein the simulation of performance of the digital twin includes by-product accumulation from the plurality of physical assets within one or more areas of interest identified within the physical ecosystem; and
providing one or more recommendations to a user corresponding to the by-product accumulation within the one or more areas of interest based on the performance of the digital twin in the plurality of conditions, wherein the one or more recommendations are displayed to the user in an industrial safety user interface.

16. The computer program product of claim 15, wherein the plurality of conditions are manually selected by the user, wherein the user manually identifies within the industrial safety user interface parameters by which the plurality of physical assets are operated.

17. The computer program product of claim 15, further comprising:
determining safety levels for each of the one or more areas of interest based on the by-product accumulation and safety precautions utilized by one or more individuals operating the physical assets of the physical ecosystem, wherein the safety levels are overlayed on the digital twin of the physical ecosystem using visual representations including at least, one or more of, unique colors, numbers or flags, which are displayed to the user within the industrial safety user interface, wherein the by-product accumulation includes at least, one or more of, dust, chemicals, smells, gases, toxins, or heat generated by the plurality of physical assets during a performance of one or more activities.

18. The computer program product of claim 15, further comprising:
adjusting settings for one or more Internet of Things (IoT) devices associated with the physical ecosystem based on the performance of the digital twin in the plurality of conditions, wherein settings of the one or more IoT devices are adjusted to control an environment of the physical ecosystem according to one or more parameters set by the user.

* * * * *